US011145614B2

(12) United States Patent
Wu et al.

(10) Patent No.: US 11,145,614 B2
(45) Date of Patent: Oct. 12, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/656,796

(22) Filed: Oct. 18, 2019

(65) Prior Publication Data
US 2021/0118835 A1    Apr. 22, 2021

(51) Int. Cl.
*H01L 23/00* (2006.01)
*H01L 21/56* (2006.01)
*H01L 21/768* (2006.01)
*H01L 23/498* (2006.01)

(52) U.S. Cl.
CPC ............ *H01L 24/17* (2013.01); *H01L 21/565* (2013.01); *H01L 21/7684* (2013.01); *H01L 23/49816* (2013.01); *H01L 2224/11849* (2013.01)

(58) Field of Classification Search
CPC ... H01L 24/17; H01L 21/565; H01L 21/7684; H01L 23/49816; H01L 2224/11849
See application file for complete search history.

(56) References Cited

U.S. PATENT DOCUMENTS

| 6,518,667 | B1 | 2/2003  | Ichida et al. |
| 8,987,922 | B2 | 3/2015  | Yu et al.     |
| 8,993,380 | B2 | 3/2015  | Hou et al.    |
| 9,000,584 | B2 | 4/2015  | Lin et al.    |
| 9,048,222 | B2 | 6/2015  | Hung et al.   |
| 9,048,233 | B2 | 6/2015  | Wu et al.     |
| 9,064,879 | B2 | 6/2015  | Hung et al.   |
| 9,111,949 | B2 | 8/2015  | Yu et al.     |
| 9,196,532 | B2 | 11/2015 | Tu et al.     |
| 9,196,559 | B2 | 11/2015 | Tsai et al.   |

(Continued)

FOREIGN PATENT DOCUMENTS

| CN | 110299329 A   | 10/2019 |
| KR | 20170063230 A | 6/2017  |

(Continued)

*Primary Examiner* — Peniel M Gumedzoe
(74) *Attorney, Agent, or Firm* — Slater Matsil, LLP

(57) ABSTRACT

A method includes placing metal-core solder balls on conductive pads of a first semiconductor device, wherein the metal-core solder balls include a metal core surrounded by a solder material, and forming a device structure, forming the device structure including placing the first semiconductor device on a carrier substrate, encapsulating the first semiconductor device with an encapsulant, wherein the encapsulant covers the metal-core solder balls, performing a planarization process on the encapsulant, wherein the planarization process exposes the metal-core solder balls, and forming a redistribution structure over the encapsulant and the first semiconductor device, wherein the redistribution structure is electrically connected to the metal-core solder balls.

20 Claims, 12 Drawing Sheets

(56) References Cited

U.S. PATENT DOCUMENTS

| | | | |
|---|---|---|---|
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,299,649 B2 | 3/2016 | Chiu et al. | |
| 9,338,460 B2 | 5/2016 | Oh et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2007/0075435 A1* | 4/2007 | Suminoe | H01L 24/10 257/777 |
| 2014/0151863 A1* | 6/2014 | Kim | H01L 24/13 257/672 |
| 2017/0271307 A1 | 9/2017 | Hiner et al. | |
| 2018/0047674 A1 | 2/2018 | Tsai et al. | |
| 2018/0096939 A1 | 4/2018 | Chiu et al. | |
| 2018/0138101 A1 | 5/2018 | Yu et al. | |
| 2018/0158768 A1 | 6/2018 | Kim et al. | |
| 2018/0350754 A1 | 12/2018 | Huang et al. | |
| 2018/0358288 A1 | 12/2018 | Lee et al. | |
| 2019/0006315 A1 | 1/2019 | Hsu et al. | |
| 2019/0013284 A1* | 1/2019 | Fang | H01L 23/055 |
| 2019/0013286 A1* | 1/2019 | Murayama | C22C 30/04 |

FOREIGN PATENT DOCUMENTS

| | | |
|---|---|---|
| TW | 201822284 A | 6/2018 |
| TW | 201834086 A | 9/2018 |
| TW | 201903996 A | 1/2019 |
| TW | 201906116 A | 2/2019 |

* cited by examiner

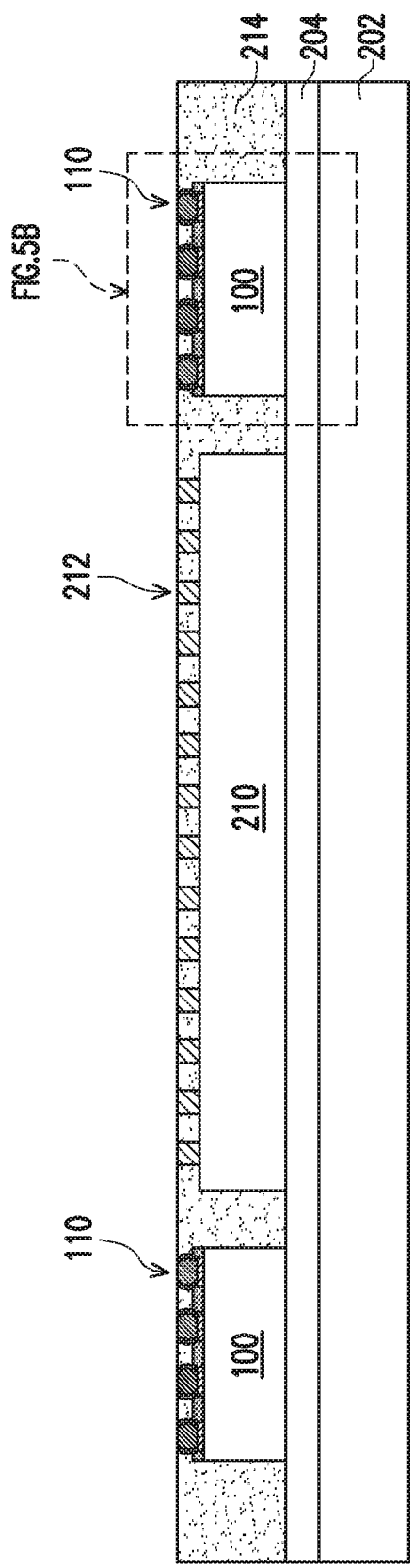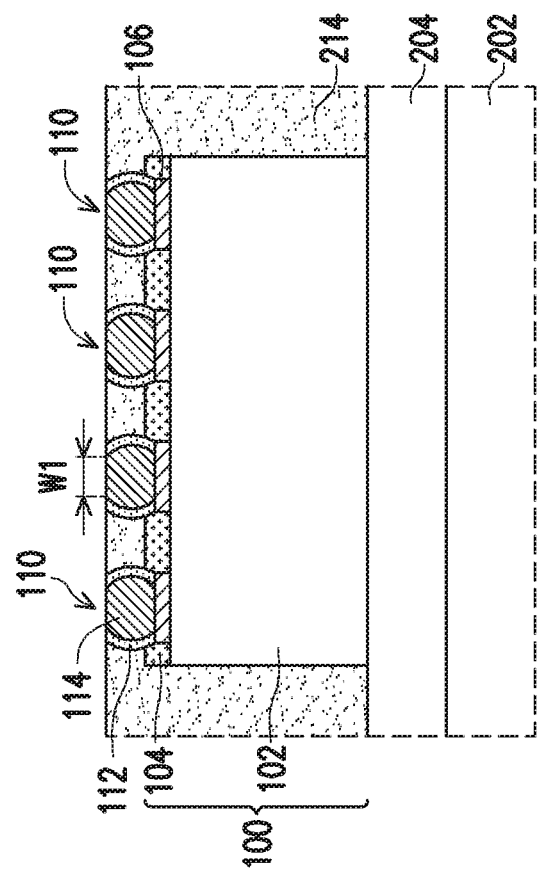
FIG. 5A
FIG. 5B

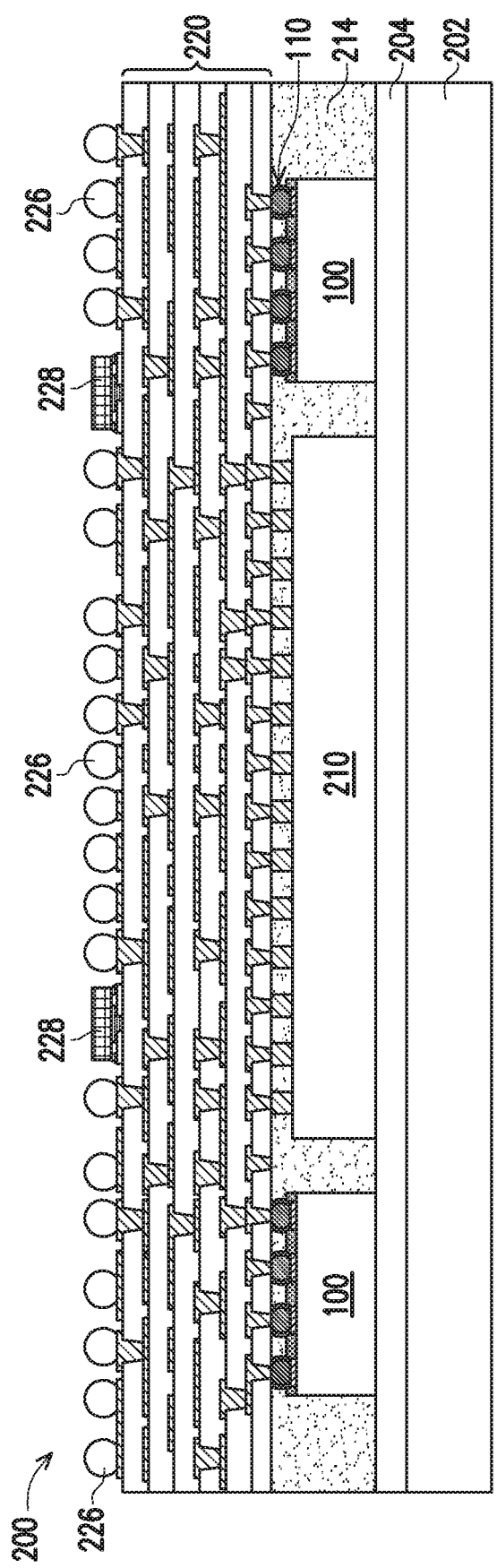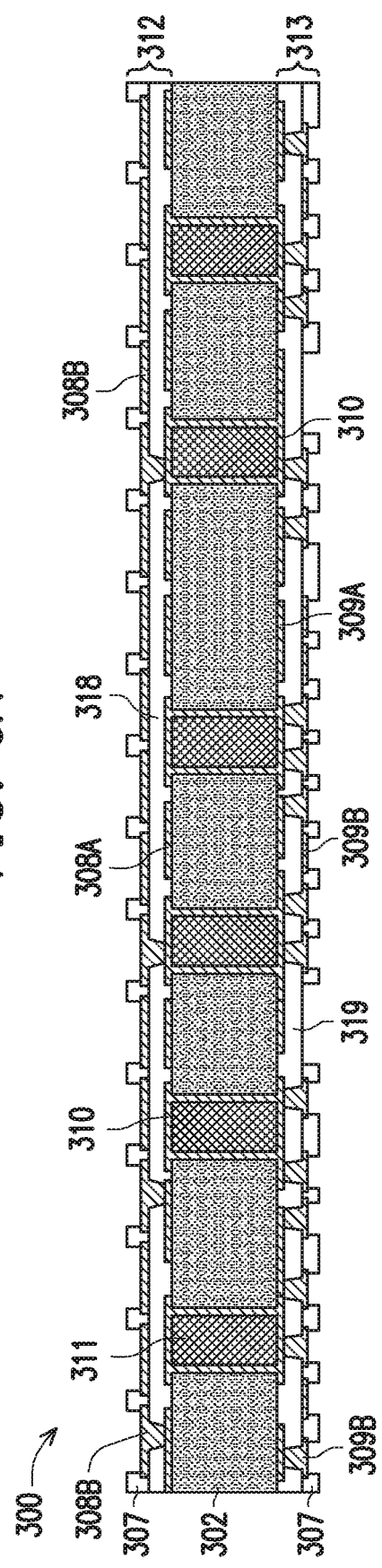

SEMICONDUCTOR DEVICE AND METHOD OF MANUFACTURE

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 8 illustrate cross-sectional views of intermediate steps of forming a package structure, in accordance with some embodiments.

FIG. 9A illustrates a cross-sectional view of a package structure, in accordance with some embodiments.

FIG. 9B illustrates a cross-sectional view of an interconnect structure, in accordance with some embodiments.

DETAILED DESCRIPTION

Figure 2:
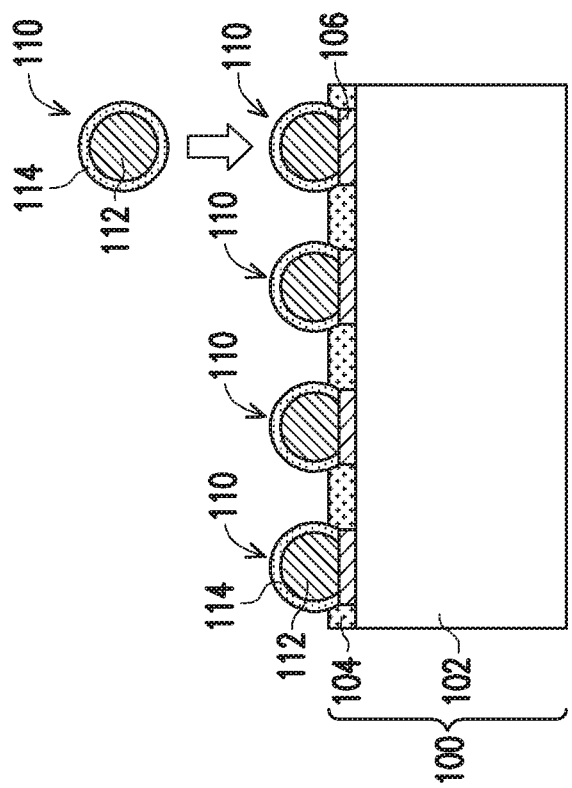
FIG. 2 illustrates a cross-sectional view of metal-core solder balls placed on the electronic device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a system-in-package. In some embodiments, a device within the package may be electrically connected to a redistribution structure using metal-core solder balls. The metal-core solder balls may be encapsulated and then planarized to expose the metal cores before forming the redistribution structure. By forming the electrical connections using metal-core solder balls, the electrical performance, yield, and reliability of the device package may be improved and the overall manufacturing cost of the device package may be reduced. An interconnect structure may be formed on a core substrate and then attached to the redistribution structure. The interconnect structure can provide rigidity to the device package and reduce the change of warping or delamination.

Figure 1:
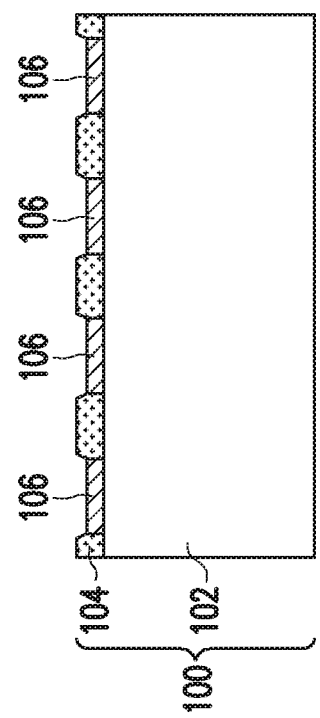
FIG. 1 illustrates a cross-sectional view of an electronic device, in accordance with some embodiments.
Figure 12:
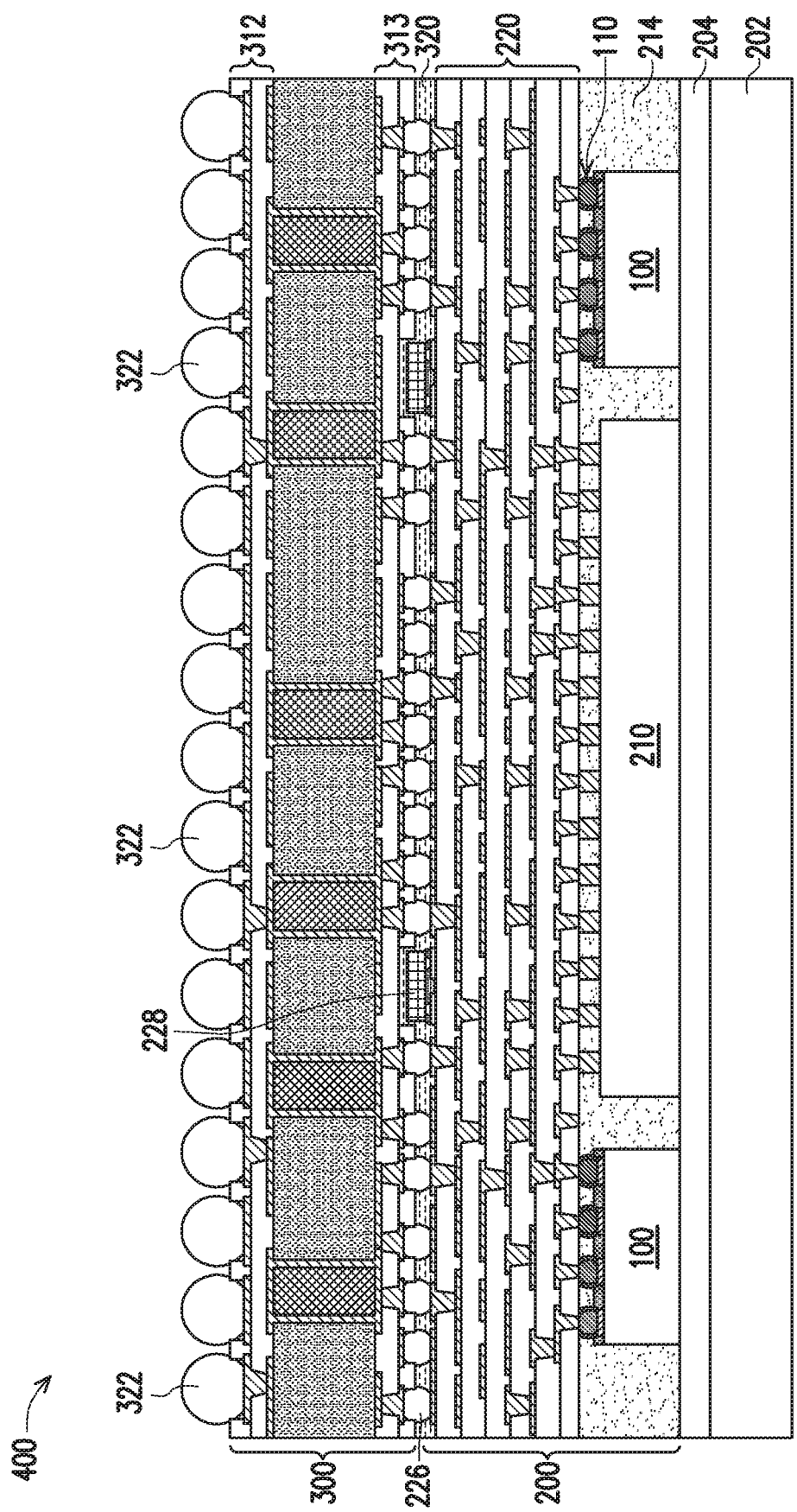

FIGS. 1 and 2 illustrate a cross-sectional views of an electronic device 100 having metal-core solder balls 110, in accordance with some embodiments. FIGS. 3 through 8 illustrate cross-sectional views of intermediate steps of forming a package structure 200 (see FIG. 8), in accordance with some embodiments. FIGS. 9A-9B through 12 illustrate cross-sectional views of intermediate steps of forming a package 400 (see FIG. 12), in accordance with some embodiments.

FIG. 1 shows an electronic device 100, in accordance with some embodiments. The electronic device 100 may be, for example, a die (e.g., an integrated circuit die, power integrated circuit die, logic die, or the like), a chip, a semiconductor device, a memory device (e.g., a memory stack, DRAM, Flash memory, High-Bandwidth Memory (HBM), or the like), a passive device (e.g., an integrated passive device (IPD), a multi-layer ceramic capacitor (MLCC), a voltage regulator, or the like), another type of electronic device, a system-on-a-chip (SoC), a component on a wafer (CoW), a package comprising one or more dies or devices, the like, or a combination thereof. The electronic device 100 may comprise one or more active devices such as transistors, diodes, or the like and/or one or more passive devices such as capacitors, resistors, inductors, or the like. In some embodiments, the electronic device 100 may be a surface-mount device (SMD) or the like. In some embodiments, the electronic device 100 has a thickness between about 100 μm and about 1200 μm and has an area between about 4 mm$^2$ and about 900 mm$^2$. The electronic device 100 shown in FIG. 1 is intended as an illustrative example, and other types, combinations, or configurations of electronic devices may be used.

In some embodiments, the electronic device 100 includes conductive connectors 106 used to make electrical connection between the electronic device 100 and other devices or components. The conductive connectors 106 may be part of an interconnect structure or a redistribution structure of the electronic device 100 in some embodiments. In some embodiments, the conductive connectors 106 include under bump metallizations (UBMs), which are not separately indicated in FIG. 1. In an embodiment, the UBMs of the conductive connectors 106 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium tungsten/copper/nickel, or an arrangement of titanium/copper/nickel/gold, that are suitable for the formation of the UBMs. Any suitable materials or combination of different layers of material that may be used for the UBMs of the conductive connectors 106 are fully intended to be included within the scope of the current application.

In some embodiments, a passivation layer 104 may be formed over the conductive connectors 106. The passivation layer 104 may be patterned to expose portions of the conductive connectors 106. In an embodiment, the passivation layer 104 may be a material such as an oxide (e.g., silicon oxide or the like), a nitride (e.g., silicon nitride or the like), polybenzoxazole (PBO), a polyimide, a polyimide derivative, the like, or another suitable material or combination of materials. In some embodiments, the passivation layer 104 may extend over portions of the conductive connectors 106. The UBMs (if present) may be formed prior to or subsequent to formation of the passivation layer 104.

Turning to FIG. 2, metal-core solder balls 110 are placed on the conductive connectors 106, in accordance with some embodiments. The metal-core solder balls 110 include a metal core 112 that may be coated in a solder layer 114. The metal core 112 may be a metal or metal alloy such as copper, a copper alloy, or the like. In some embodiments, the metal core 112 may be approximately spherical in shape, and may have a diameter that is between about 14 μm and about 600 μm, though the metal core 112 may have other dimensions in other embodiments. In other embodiments, the metal core 112 may have a different shape than a spherical shape, such as a cylindrical shape, an irregular shape, or another shape. The solder layer 114 may partially or completely cover the metal core 112 prior to placement of a metal-core solder ball 110. The solder layer 114 may be a solder material such as SnAg, SnCu, SnBi, SnAgCu, or the like. The solder layer 114 may have a thickness that is between about 1 μm and about 200 μm in some embodiments, although the solder layer 114 may have a different thickness than given or different portions of the solder layer 114 may have different thicknesses. In some embodiments, metal-core solder ball 110 may be approximately spherical in shape, and may have a diameter that is between about 15 μm and about 610 μm, though a metal-core solder ball 110 may have other dimensions in other embodiments. In other embodiments, metal-core solder balls 110 may have a different shape than a spherical shape, such as a cylindrical shape, an irregular shape, or another shape.

Figure 6:
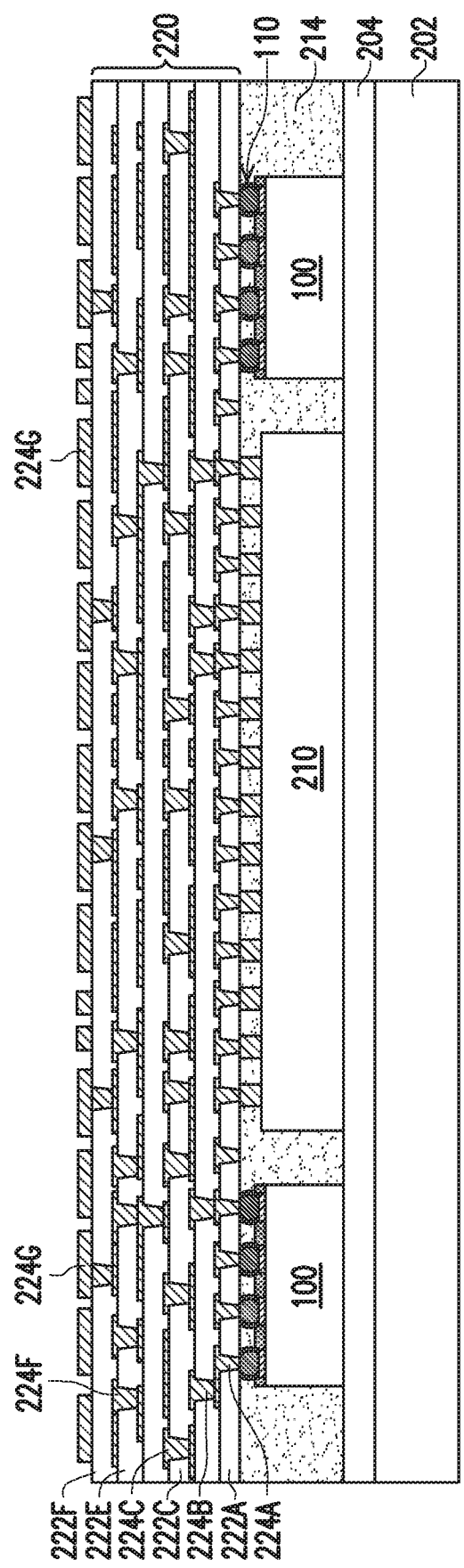

In some cases, the presence of the metal core 112 in a metal-core solder ball 110 may allow for improved conduction and connection reliability between a device such as an electronic device 100 and another component (e.g., the redistribution structure 220 shown in FIG. 6). In some cases, during high-speed operation (e.g., greater than about 2 Gbit/second), electrical signals may be conducted near the surfaces of conductive components. Metal cores 112 may have less surface roughness than solder, and thus the use of metal-core solder balls 110 can reduce resistance experienced by higher-speed signals and also reduce signal loss (e.g. insertion loss) during high-speed operation. This can improve the performance of high-speed circuits, for example, Serializer/Deserializer ("SerDes") circuits or other circuits that may be operated at higher speeds. In some cases, metal cores 112 may have a roughness RA less than about 0.1 μm. In some cases, metal cores 112 may be more robust to thermal effects than solder and thus may have greater reliability than other types of connections.

In some embodiments, the metal-core solder balls 110 are placed on the conductive connectors 106 using a stencil technique. For example, a stencil with openings corresponding to the locations of the conductive connectors 106 may be aligned with the conductive connectors 106, and the metal-core solder balls 110 placed or otherwise deposited within the stencil openings such that a metal-core solder ball 110 contacts a corresponding conductive connector 106. In some embodiments, a flux material may be applied to the conductive connectors prior to placement of the metal-core solder balls 110. A reflow process may be performed to reflow the material of the solder layer 114 of the metal-core solder balls 110 and bond the metal-core solder balls 110 to the conductive connectors 106. After performing the reflow process, the metal core 112 of each metal-core solder ball 110 may physically contact a conductive connector 106 or may be separated from a conductive connector 106 by a portion of solder layer 114 (and/or flux, if present). This portion of the solder layer 114 may be thinner than the original thickness of solder layer 114 prior to performing the reflow process. Ball-placement techniques or other suitable techniques for placing the metal-core solder balls 110 may be used in other embodiments. In some embodiments, the pitch of the metal-core solder balls 110 on an electronic device 100 may be between about 30 μm and about 1000 μm.

Figure 3:
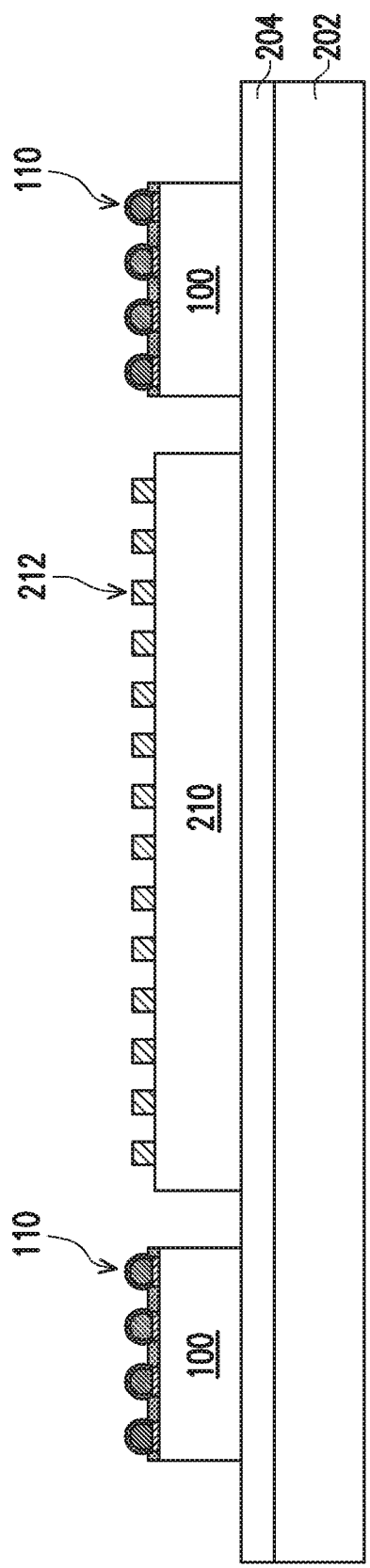

FIGS. 3 through 8 illustrate cross-sectional views of intermediate steps of forming a package 200 (see FIG. 8) using metal-core solder balls 110, in accordance with some embodiments. With reference now to FIG. 3, there is shown a carrier substrate 202 on which one or more devices, such as electronic devices 100 and/or semiconductor devices 210 (described below), have been placed, in accordance with some embodiments. FIG. 3 shows a single semiconductor device 210 and two electronic devices 100, but in other embodiments another number of semiconductor devices 210 and/or another number of electronic devices 100 may be placed on the carrier substrate 202. The electronic devices 100 may be similar types of electronic device or different types of electronic device. The electronic devices 100 and semiconductor device 210 may be placed in any suitable arrangement or configuration.

The carrier substrate 202 may include, for example, silicon-based materials, such as a silicon substrate (e.g., a silicon wafer), a glass material, silicon oxide, or other materials, such as aluminum oxide, the like, or a combination. In some embodiments, the carrier substrate 202 may be a panel structure, which may be, for example, a supporting substrate formed from a suitable dielectric material, such as a glass material, a plastic material, or an organic material. The panel structure may be, for example, a rectangular panel. The carrier substrate 202 may be planar in order to accommodate an attachment of devices such as the electronic devices 100 or semiconductor devices 210.

Figure 13A:
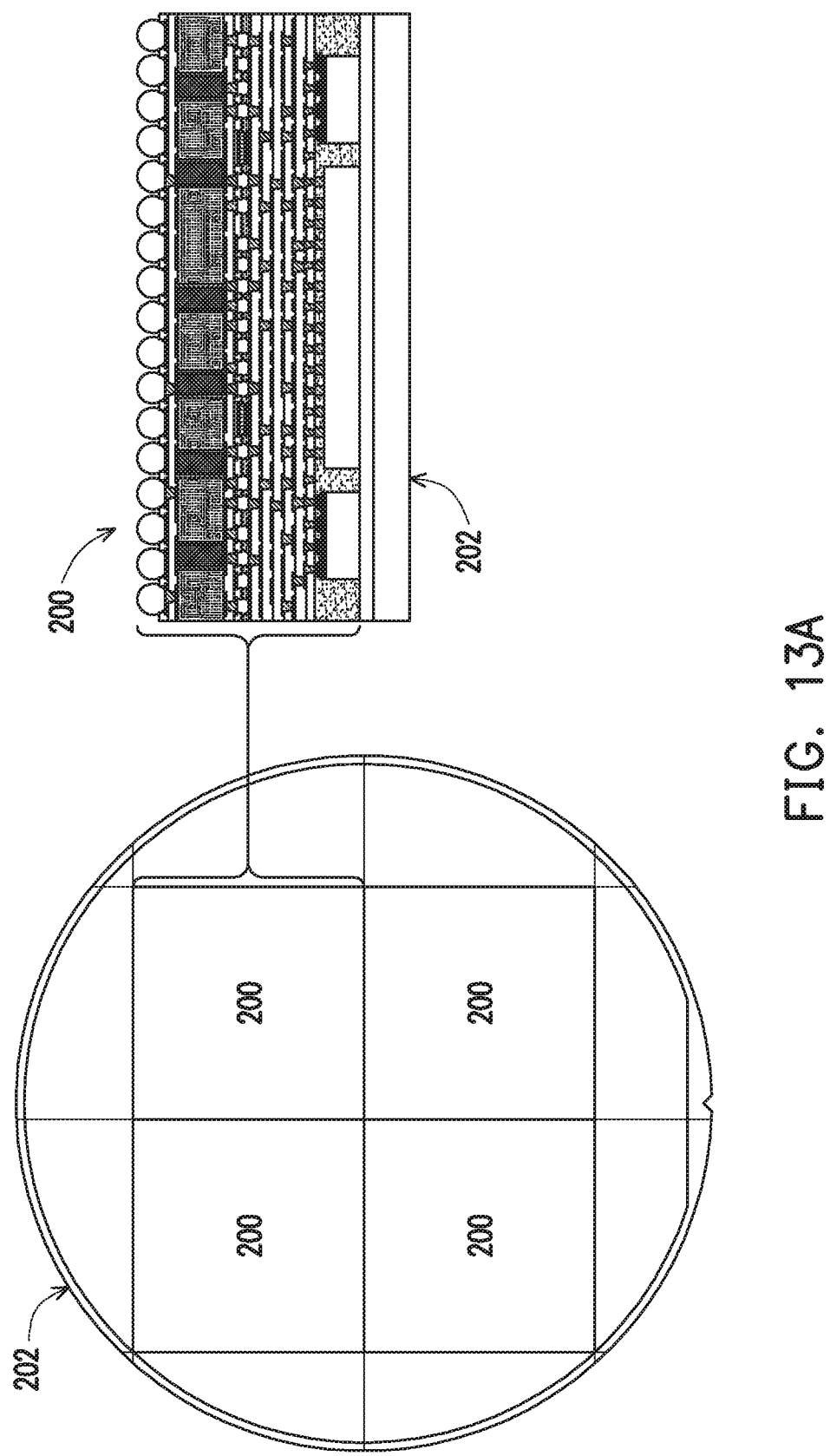
FIGS. 13A and 13B illustrate intermediate steps of forming a package structure on different types of carrier substrates, in accordance with some embodiments.
Figure 13B:
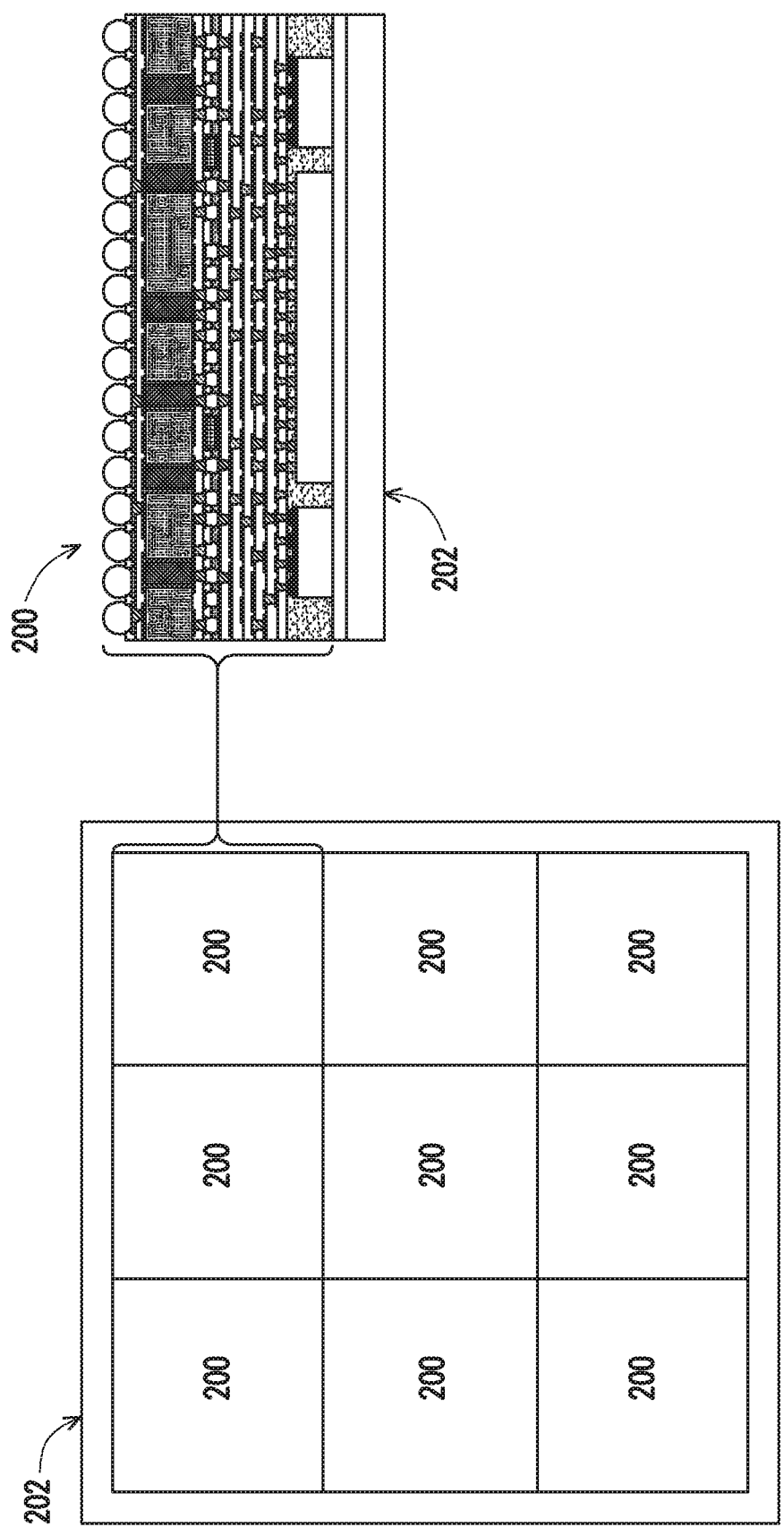

As illustrative examples, FIGS. 13A and 13B show package structures 200 (see FIG. 9A) formed using different types of carrier substrates 202, in accordance with some embodiments. FIG. 13A shows an embodiment in which the carrier substrate 202 is a silicon wafer, and FIG. 13B shows an embodiment in which the carrier substrate 202 is a panel structure. FIGS. 13A-13B show multiple package structures 200 formed on the carrier substrates 202. In this manner, different types of carrier substrates 202 may be used to form multiple package structures 200. The different types of carrier substrates 202 may also be used to form multiple packages 400 (see FIG. 12). The package structures 200 or packages 400 formed on the carrier substrate 202 may be subsequently singulated to form individual package structures 200 or individual packages 400.

Turning back to FIG. 3, in some embodiments, a release layer 204 may be formed on the top surface of the carrier substrate 202 to facilitate subsequent debonding of the carrier substrate 202. In some embodiments, the release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a Light-to-Heat-Conversion (LTHC) release coating. In other embodiments, the release layer 204 may be an ultra-violet (UV) glue, which loses its adhesive property when exposed to UV light. The release layer 204 may be dispensed as a liquid and cured, may be a laminate film laminated onto the carrier substrate 202, or the like. The top surface of the release layer 204 may be leveled and may have a high degree of co-planarity. In some embodiments, a die attach film (DAF) (not shown) may be used instead of or in addition to the release layer 204.

The semiconductor device 210 may include one or more devices, which may include devices designed for an intended purpose such as a memory die (e.g., a DRAM die, a stacked memory die, a high-bandwidth memory (HBM) die, etc.), a logic die, a central processing unit (CPU) die, a system-on-a-chip (SoC), a component on a wafer (CoW), an integrated fan-out structure (InFO), a package, the like, or a combination thereof. In an embodiment, the semiconductor device 210 includes integrated circuit devices, such as transistors, capacitors, inductors, resistors, metallization layers, external connectors, and the like, therein, as desired for a particular functionality. In some embodiments, the semiconductor device 210 may include more than one of the same type of device, or may include different devices. In some embodiments, the semiconductor device 210 may be similar to an electronic device 100 as described previously in FIG. 1.

In an embodiment, the semiconductor device 210 comprises contacts 212. In some embodiments, the contacts 212 may be conductive pillars such as copper pillars or copper posts. In other embodiments, the contacts 212 may be solder bumps, copper bumps, or other suitable contact structures that may be used to provide electrical connection to the semiconductor device 210. All such contacts are fully intended to be included within the scope of the embodiments. In other embodiments, the contacts 212 may be formed using metal-core solder balls similar to the metal-core solder balls 110 described previously. In some embodiments, the pitch of the contacts 212 on a semiconductor device may be between about 30 μm and about 300 μm.

Figure 4:
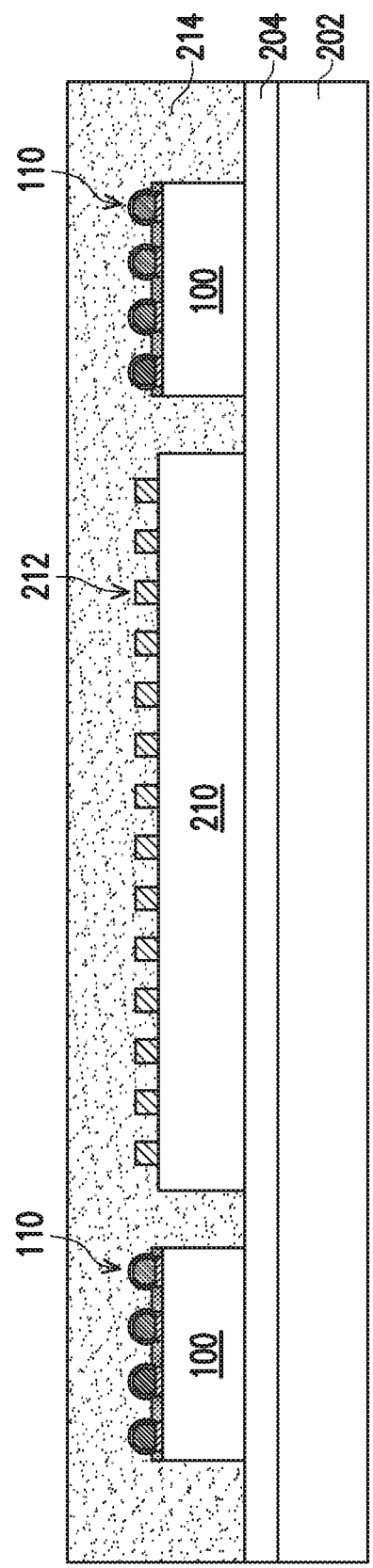

Turning to FIG. 4, the electronic devices 100 and semiconductor device 210 are encapsulated using an encapsulant 214, in accordance with some embodiments. The encapsulation may be performed in a molding device or the encapsulant 214 may be deposited using another technique. The encapsulant 214 may be, for example, a molding compound such as a resin, polyimide, PPS, PEEK, PES, another material, the like, or a combination thereof. The encapsulant 214 may surround and/or cover the metal-core solder balls 110 and contacts 212, as shown in FIG. 4.

In FIGS. 5A-B, a planarization process is performed on the encapsulant 214 to expose the metal-core solder balls 110 and contacts 212, in accordance with some embodiments. The planarization process may be performed, e.g., using a mechanical grinding process or chemical mechanical polishing (CMP) process, or the like. The planarization process removes excess portions of encapsulant 214 and exposes the metal-core solder balls 110 and contacts 212. In some cases, upper portions of the metal-core solder balls 110 and/or contacts 212 may be removed by the planarization process. For example, turning to FIG. 5B, a magnified view is shown of an electronic device 100 after the planarization process has been performed, in accordance with some embodiments. As shown in FIG. 5B, the planarization process has removed a portion of the solder layer 114 over the metal cores 112 of the metal-core solder balls 110, and has also removed an upper portion of the metal cores 112 of the metal-core solder balls 110. After the planarization process, the metal-core solder balls 110 may have exposed surfaces that are approximately flat. Some or all of the metal-core solder balls 110 of the electronic device 100 may have level surfaces, and some or all of the metal-core solder balls 110 may have surfaces level with a surface of the encapsulant 214 and/or the exposed surfaces of contacts 212 (shown in FIG. 5A). In some cases, after the planarization process, the exposed surfaces of the metal cores 112 may have a width W1 that is between about 10 μm and about 300 μm. In some cases, the exposed surfaces of the metal cores 112 may be approximately circular in shape, and the width W1 corresponds to a diameter. As shown in FIG. 5B, the metal cores 112 of the metal-core solder balls 110 allow encapsulation and planarization processes to be used to form relatively uniform and planar conductive surfaces for electrical connections to be subsequently be formed to the electronic devices 100, such as the redistribution structure 220 shown in FIG. 6. In this manner, forming conductive surfaces in this manner using metal-core solder balls 110 can improve reliability, reduce resistance, and improve yield of the electrical connections to the electronic devices 100.

Turning to FIG. 6, a redistribution structure 220 is formed over the electronic devices 100, the semiconductor device 210, and the encapsulant 214, in accordance with some embodiments. The redistribution structure 220 makes electrical connections to the metal-core solder balls 110 of the electronic devices 100 and to the contacts 212 of the semiconductor device 210. The redistribution structure 220 shown includes insulating layers 222A-F (for clarity, not all of insulating layers 222A-F are labeled) and includes redistribution layers 224A-G (for clarity, not all of redistribution layers 224A-G are labeled). In other embodiments, different numbers of insulating layers or redistribution layers may be formed in the redistribution structure 220 than shown in FIG. 6. For example, in some embodiments, the redistribution structure 220 may include between about 1 and about 15 insulation layers or redistribution layers, or another number of insulation layers or redistribution layers. In some embodiments, the redistribution structure 220 may be, for example, a fan-out structure.

Still referring to FIG. 6, a first insulating layer 222A is formed over the electronic devices 100, the semiconductor device 210, and the encapsulant 214. The insulating layer 222A may be made of one or more suitable dielectric materials such as an oxide (e.g., silicon oxide), a nitride (e.g., silicon nitride), a polymer material, a polyimide material, a low-k dielectric material, a molding material, another dielectric material, the like, or a combination thereof. The insulating layer 222A may be formed by a process such as spin-coating, lamination, CVD, the like, or a combination thereof. The insulating layer 222A may have a thickness between about 1 µm and about 50 µm, such as about 5 µm, although any suitable thickness may be used. Openings into the insulating layer 222A may be formed using a suitable photolithographic mask and etching process. For example, a photoresist may be formed and patterned over the insulating layer 222A, and one or more etching processes (e.g., a wet etching process or a dry etching process) are utilized to remove portions of the insulating layer 222A. In some embodiments, the insulating layer 222A is formed of a photosensitive polymer such as PBO, polyimide, BCB, or the like, in which openings may be patterned directly using a photolithographic mask and etching process. The openings in the insulating layer 222A may expose metal-core solder balls 110 of the electronic devices 100 and contacts 212 of the semiconductor device 210.

A first redistribution layer 224A is then formed over the insulating layer 222A. The redistribution layer 224A may be a patterned conductive layer (e.g., a metallization pattern) that includes line portions (also referred to as conductive lines) on and extending along the major surface of the insulating layer 222A. The redistribution layer 224A further includes via portions (also referred to as conductive vias) extending through the insulating layer 222A to physically and electrically couple the electronic devices 100 and the semiconductor device 210. In an embodiment, the redistribution layer 224A may be formed by initially forming a seed layer (not shown). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a suitable formation process such as PVD, CVD, sputtering, or the like. The seed layer is formed over the insulating layer 222A and over the metal-core solder balls 110 of the electronic devices 100 and the contacts 212 of the semiconductor device 210 that are exposed by openings in the insulating layer 222A. A photoresist (also not shown) may then be formed to cover the seed layer and then be patterned to expose those portions of the seed layer that are located where the redistribution layer 224A will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may alternatively be used to form the redistribution layer 224A. Once the conductive material has been formed, the photoresist may be removed through a suitable removal process such as an ashing process or a chemical stripping process, such as using oxygen plasma or the like. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the redistribution layer 224A. Portions of the redistribution layer 224A extending over the insulating layer 222A may have a thickness of between about 1 µm and about 25 µm in some embodiments, although any suitable thickness may be used. In this manner, the redistribution layer 224A may form electrical connections to the electronic devices 100 and semiconductor device 210. In some cases, the use of metal cores 112 formed from copper or a copper alloy in the metal-core solder balls 110 may improve performance and reliability of the electrical connection between the electronic devices 100 and the redistribution structure 220 when the first redistribution layer 224A is made from copper or a copper alloy. For example, a copper-copper bond formed between the metal-core solder balls 110 and the first redistribution layer 224A may be more conductive and less sensitive to thermal issues than a bond between, for example, copper and a solder material.

Additional insulating layers 222B-F and redistribution layers 224B-G may then be formed over the redistribution layer 224A and insulating layer 222A to provide additional routing along with electrical connection within the redistribution structure 220. The insulating layers 222B-G and redistribution layers 224B-G may be formed in alternating layers, and may be formed using processes and materials similar to those used for the insulating layer 222A or the redistribution layer 224A. For example, an insulating layer (e.g., insulating layer 222B) may be formed over a redistribution layer (e.g., redistribution layer 224A), and then openings made through the insulating layer to expose portions of the underlying redistribution layer using a suitable photolithographic mask and etching process. A seed layer may be formed over the insulating layer and conductive material formed on portions of the seed layer, forming an overlying redistribution layer (e.g., redistribution layer 224B). These steps may be repeated to form the redistribution structure 220 having a suitable number and configuration of insulation layers and redistribution layers. Alternatively, the insulating layer 222B-F or redistribution layers 224B-G may be formed differently than the insulating layer 222A or redistribution layer 224A. In other embodiments, the redistribution structure 220 may be formed in a different process than described herein.

Figure 7:
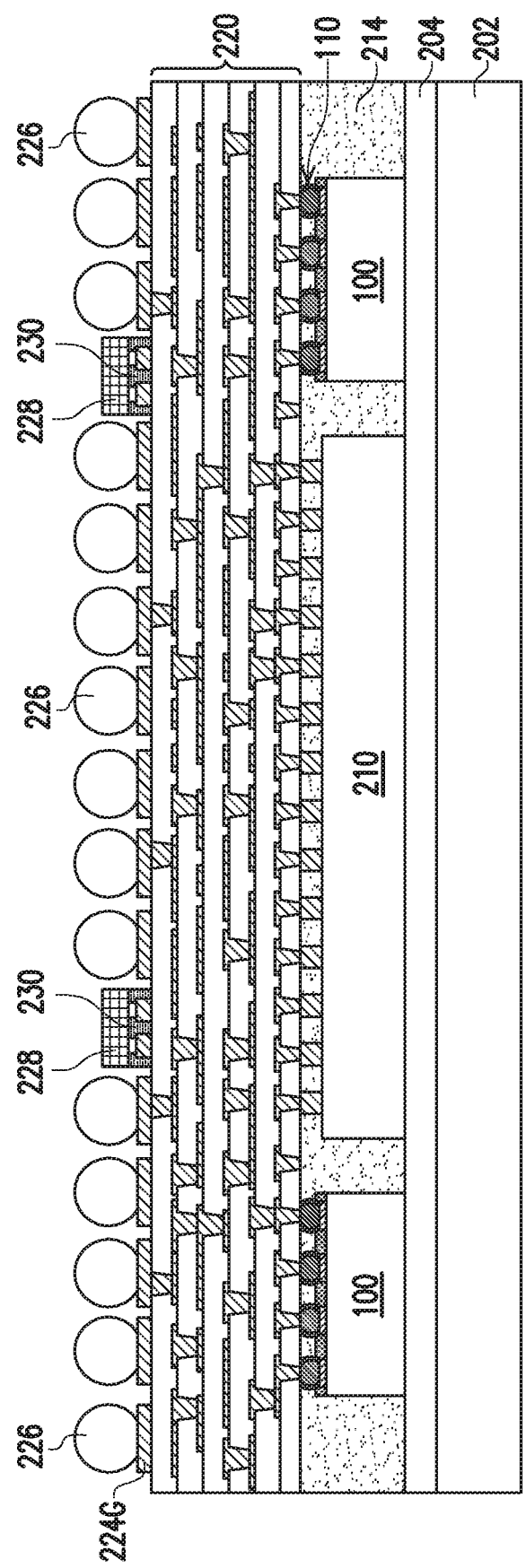

Turning to FIG. 7, external connectors 226 are formed on the redistribution structure 220. In some embodiments, under-bump metallization structures (UBMs, not shown) are first formed on portions of the topmost redistribution layer of the redistribution structure 220 (e.g., redistribution layer 224G in FIG. 6). The UBMs may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the redistribution structure 220. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed. In some embodiments, the UBMs are formed over the topmost redistribution layer as part of formation of the redistribution structure 220, which may include using the same photolithographic steps used to form the topmost redistribution layer. For example, layers of the UBMs may be deposited over the topmost redistribution layer, and then excess material of the topmost redistribution layer and the UBMs removed in the same process. In some embodiments, the UBMs may be part of the topmost redistribution layer of the redistribution structure 220 and may, for example, extend through the topmost insulating layer of the redistribution structure 220 (e.g., insulating layer 222F in FIG. 6).

In FIG. 7, external connectors 226 are then formed on the topmost redistribution layer of the redistribution structure 220 (e.g., on redistribution layer 224G or on the UBMs, if present). The external connectors 226 may be ball grid array (BGA) connectors, solder balls, metal pillars, controlled collapse chip connection ($C_4$) bumps, micro bumps, electroless nickel-electroless palladium-immersion gold technique (ENEPIG) formed bumps, or the like. The external connectors 226 may include a conductive material such as solder, copper, aluminum, gold, nickel, silver, palladium, tin, the like, or a combination thereof. In some embodiments, the external connectors 226 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 106 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the pitch of the external connectors 226 may be between about 150 μm and about 1250 μm.

Still referring to FIG. 7, one or more integrated devices 228 are attached to the topmost redistribution layer (or UBMs, if present) of the redistribution structure 220 to make electrical connection with the redistribution structure 220. The integrated devices 228 may be, for example, a semiconductor device or other device that includes one or more passive devices such as capacitors, resistors, inductors, and the like. The integrated devices 228 may be, for example, integrated passive devices (IPDs). The integrated devices 228 attached to the redistribution structure 220 may be similar devices or may be different types of devices. FIG. 7 illustrates the placement of two integrated devices 228, but in other embodiments more or fewer integrated devices 228 may be attached. In other embodiments, the integrated devices 228 may be attached before formation of the external connectors 226. The integrated devices 228 may be attached by, for example, sequentially dipping connectors (e.g., conductive bumps or pads) of the integrated devices 228 such as solder balls (not shown) into flux, and then using a pick-and-place tool in order to physically align the connectors of the integrated devices 228 with corresponding regions of the redistribution structure 220. In some cases, a reflow process may be performed to bond the connectors of the integrated devices 228. In some cases, the reflow process may be performed on both the integrated devices 228 and the external connectors 226.

Still referring to FIG. 7, one or more integrated devices 228 are attached to the topmost redistribution layer (or UBMs, if present) of the redistribution structure 220 to make electrical connection with the redistribution structure 220. The integrated devices 228 may be, for example, a semiconductor device or other device that includes one or more passive devices such as capacitors, resistors, inductors, and the like. The integrated devices 228 may be, for example, integrated passive devices (IPDs). The integrated devices 228 attached to the redistribution structure 220 may be similar devices or may be different types of devices. FIG. 7 illustrates the placement of two integrated devices 228, but in other embodiments more or fewer integrated devices 228 may be attached. In other embodiments, the integrated devices 228 may be attached before formation of the external connectors 226. The integrated devices 215 may be attached by, for example, sequentially dipping connectors (e.g., conductive bumps or pads) of the integrated devices 228 such as solder balls (not shown) into flux, and then using a pick-and-place tool in order to physically align the connectors of the integrated devices 228 with corresponding regions of the redistribution structure 220. In some cases, a reflow process may be performed to bond the connectors of the integrated devices 228. In some cases, the reflow process may be performed on both the integrated devices 228 and the external connectors 226.

In some embodiments, an underfill 230 is formed between each integrated device 228 and the redistribution structure 220, surrounding the connectors of the integrated devices 228. The underfill 230 may reduce stress and protect the joints from damage resulting from the reflow process. The underfill 230 may be formed by a capillary flow process after the integrated devices 228 are attached, or may be formed by a suitable deposition method before the integrated devices 228 are attached. In some embodiments in which a flux is used to attach the integrated devices 228, it may act as the underfill.

Figure 8:
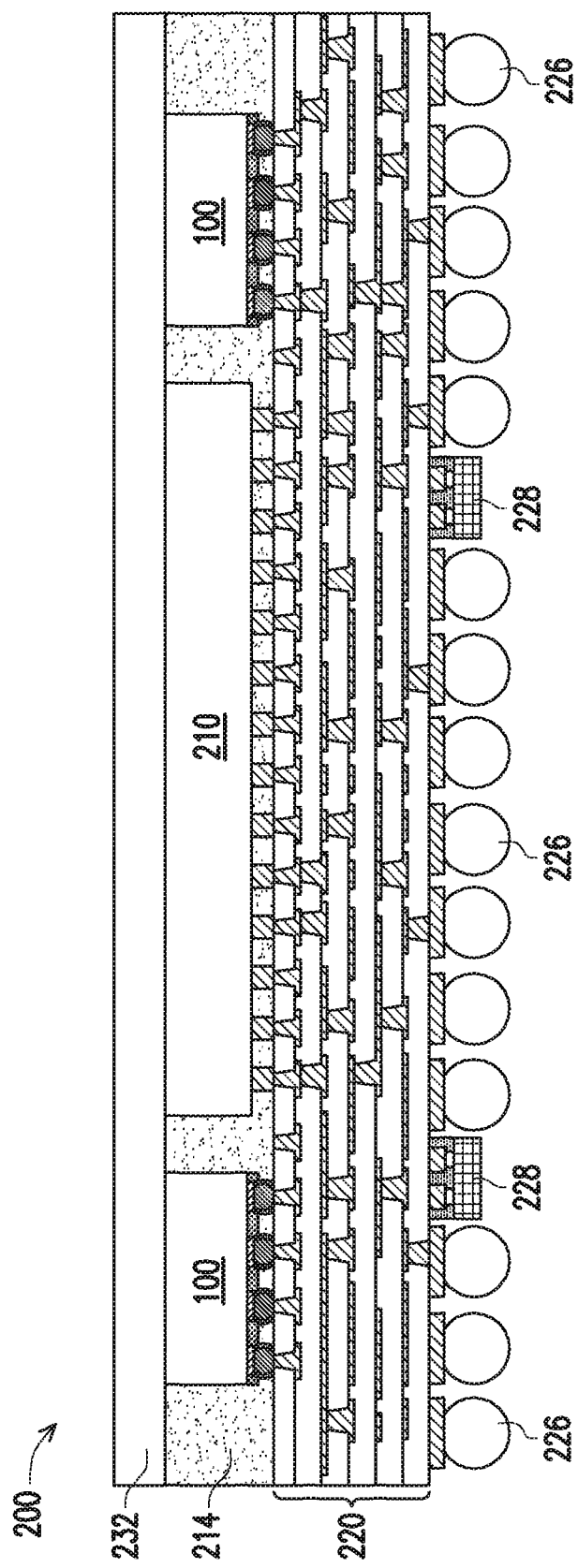

Turning to FIG. 8, the carrier substrate 202 is de-bonded to detach (or "de-bond") the carrier substrate 202 from the electronic devices 100, semiconductor device 210, and encapsulant 214, in accordance with some embodiments. In this manner, a package structure 200 may be formed using metal-core solder balls 110 to bond electronic devices 100, which can improve device performance and yield. In some embodiments, the de-bonding includes projecting a light such as a laser light or an UV light on the release layer 204 so that the release layer 204 decomposes under the heat of the light and the carrier substrate 202 can be removed. In some embodiments, multiple package structures 200 are formed on the carrier substrate 202 and singulated to form separate package structures 200. In some embodiments, an optional lid 232 may be attached to package structure 200 using e.g. a thermal adhesive. The lid 232 may be used to facilitate heat dissipation and to protect the package structure 200, and may be formed from suitable materials such as a metal, semiconductor material, dielectric material, or combination thereof.

FIGS. 9A-B through 12 illustrate cross-sectional views of intermediate steps of forming a package 400 (see FIG. 12), in accordance with some embodiments. The package 400 includes a package structure 200 shown in FIG. 9A, which may be similar to the package structure 200 described with respect to FIG. 7 (e.g., prior to de bonding the carrier substrate 202). For example, the package structure 200 shown in FIG. 9A includes electronic devices 100 connected using metal-core solder balls 110. The package structure 200 shown in FIG. 9A is attached to an interconnect structure 300 (see FIG. 9B) to form package 400. The interconnect structure 300 provides additional routing and stability to the package structure 200. For example, the interconnect structure 300 can reduce warping of the package structure 200, especially for package structures 200 having large areas (e.g., greater than about 90 mm$^2$). In some embodiments, the interconnect structure 300 can include power planes or ground planes formed along with routing layers (e.g., routing layers 308A-B or 309A-B in FIG. 9B) can provide additional stability to electrical power provided to the package structure 200 and can provide improved power/ground synchronization. In this manner, an interconnect structure 300 can provide both physical and operational benefits to the package structure 200 in a package 400.

Turning to FIG. 9B, an interconnect structure 300 is shown in accordance with some embodiments. In some embodiments, the interconnect structure 300 may be, for example, an interposer or a "semi-finished substrate," and may be free of active devices. In some embodiments, interconnect structure may include routing layers formed on a core substrate 302. The core substrate 302 may include a material such as Ajinomoto build-up film (ABF), a pre-impregnated composite fiber (prepreg) material, an epoxy, a molding compound, an epoxy molding compound, fiber-glass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 302 may have a thickness between about 30 μm and about 2000 μm, such as about 500 μm or about 1200 μm.

The interconnect structure 300 may have one or more routing structures 312/313 formed on each side of the core substrate 302 and through vias 310 extending through the core substrate 302. The routing structures 312/313 and through vias 310 provide additional electrical routing and interconnection. The routing structures 312/313 may include one or more routing layers 308A-B/309A-B and one or more dielectric layers 318/319. In some embodiments, the routing layers 308A-B/309A-B and/or through vias 310 may comprise one or more layers of copper, nickel, aluminum, other conductive materials, the like, or a combination thereof. In some embodiments, the dielectric layers 318/319 may be include materials such as a build-up material, ABF, a prepreg material, a laminate material, another material similar to those described above for the core substrate 302, the like, or combinations thereof. The interconnect structure 300 shown in FIG. 9B shows two routing structures having a total of four routing layers, but more or fewer routing layers may be formed on either side of the core substrate 302 in other embodiments.

In some embodiments, the openings in the core substrate 302 for the through vias 310 may be filled with a filler material 311. The filler material 311 may provide structural support and protection for the conductive material of the through via 310. In some embodiments, the filler material 311 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 311 may include pigments or dyes (e.g., for color), or other fillers and additives that modify rheology, improve adhesion, or affect other properties of the filler material 311. In some embodiments, the conductive material of the through vias 310 may completely fill the through vias 310, omitting the filler material 311.

In some embodiments, the interconnect structure 300 may include a passivation layer 307 formed over one or more sides of the interconnect structure 300. The passivation layer 307 may be a material such as a nitride, an oxide, a polyimide, a low-temp polyimide, a solder resist, combinations thereof, or the like. Once formed, the passivation layer 307 may be patterned (e.g., using a suitable photolithographic and etching process) to expose portions of the routing layers 308A-B/309A-B of the routing structures 312/313.

Figure 10:
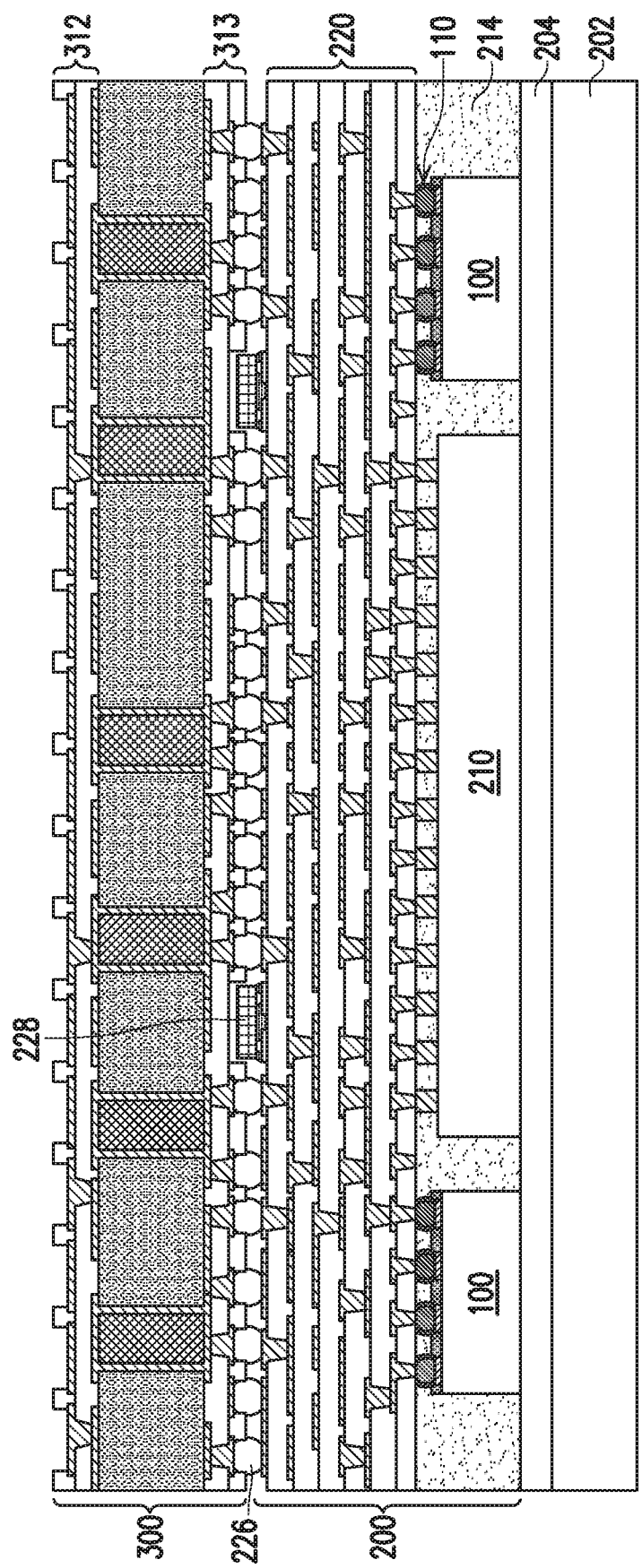
FIGS. 10 through 12 illustrate cross-sectional views of intermediate steps of forming a package, in accordance with some embodiments.

FIG. 10 illustrates a placement of an interconnect structure 300 into electrical connection with a package structures 200, in accordance with some embodiments. FIG. 10 shows a single interconnect structure 300 bonded to a single package structure 200, but in some embodiments, multiple interconnect structures 300 may be bonded to multiple package structures formed on the carrier substrate 202 and subsequently singulated to form multiple separate packages 400. In an embodiment, the interconnect structure 300 are placed into physical contact with the external connectors 226 on the package structure 200 using, e.g., a pick and place process. The interconnect structure 300 may be placed such that exposed regions of the topmost routing layer of a routing structure (e.g., routing structure 313) are aligned with corresponding external connectors 226 of the package structure 200. Once in physical contact, a reflow process may be utilized to bond the external connectors 226 of the package structure 200 to the interconnect structure 300. In some embodiments, external connectors are formed on the interconnect structure 300 instead of or in addition to the external connectors 226 formed on the package structure 200. In some embodiments, external connectors 226 are not formed on the package structure 200, and the interconnect structure 300 is bonded to the package structure 200 using a direct bonding technique such as a thermocompression bonding technique.

Figure 11:
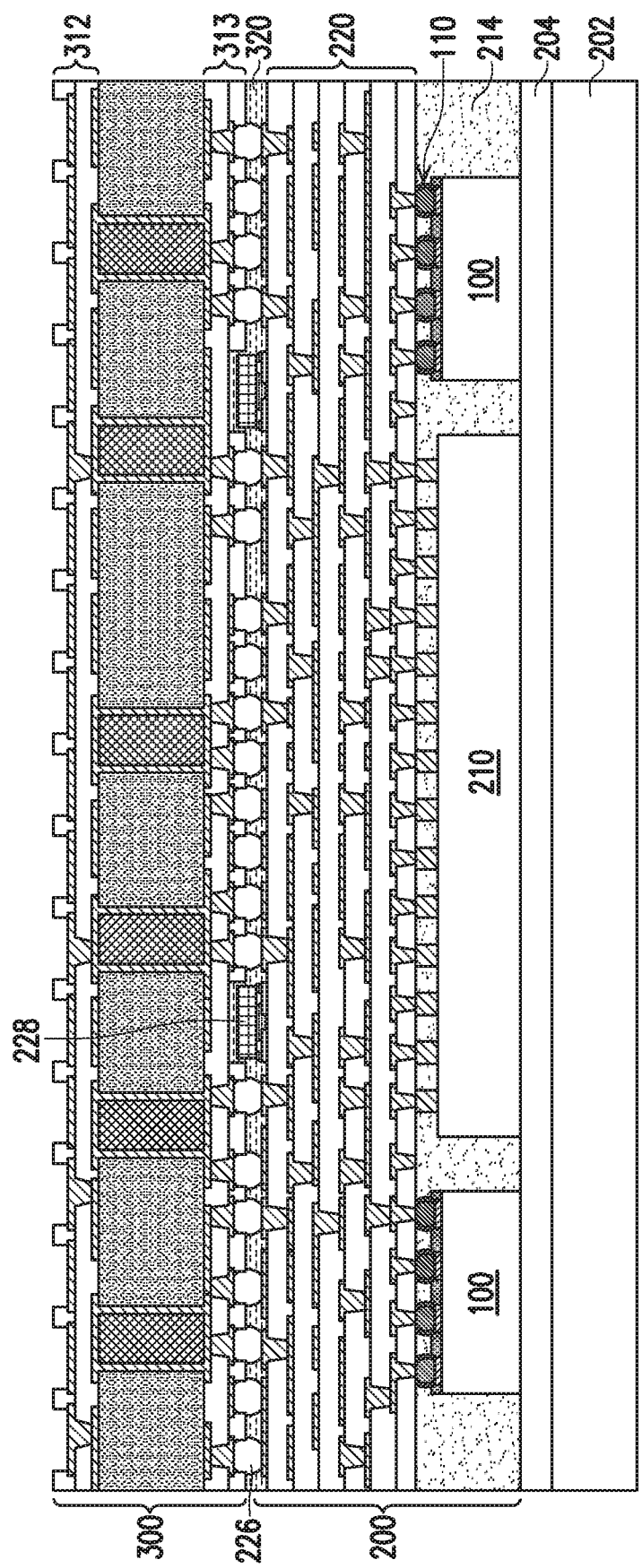

In FIG. 11, an underfill 320 is deposited along the sidewalls of the interconnect structure 300 and in the gap between the interconnect structure 300 and the package structure 200. The underfill 320 may be a material such as a molding compound, an epoxy, an underfill, a molding underfill (MUF), a resin, or the like. The underfill 320 can protect the external connectors 226 and provide structural support for the package structure 200. In some embodiments, the underfill 320 may be cured after deposition. In some embodiments, the underfill 320 may be thinned after deposition. The thinning may be performed, e.g., using a mechanical grinding or CMP process. In some embodiments, the underfill 320 may be deposited over the routing structure 312, and the thinning may expose the topmost routing layer of the routing structure 312.

In FIG. 12, external connectors 322 are formed over and electrically connected to the interconnect structure 300, forming package 400. The external connectors 322 may be formed on exposed portions of the topmost routing layer of the routing structure 312. In some embodiments, UBMs are formed on the routing structure 312, and the external connectors 322 are formed over the UBMs. In some embodiments a protective layer (not shown) is first formed over the routing structure 312. The protective layer may be formed over UBMs, if present. The protective layer may be formed from one or more suitable dielectric materials such as polybenzoxazole (PBO), a polymer material, a polyimide material, a polyimide derivative, an oxide, a nitride, the like, or a combination thereof. Openings may be formed in the protective layer to expose portions of the routing structure 312 (which may include UBMs, if present). The external connectors 322 are formed over the exposed portions of the routing structure 312, and make electrical connection to the routing structure 312. The external connectors 322 may be, for example, contact bumps or solder balls, although any suitable types of connectors may be utilized. In an embodiment in which the external connectors 322 are contact bumps, the external connectors 322 may include a material such as tin, or other suitable materials, such as silver, lead-free tin, or copper. In an embodiment in which the external connectors 322 are tin solder bumps, the external connectors 322 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 322. In some embodiments, the external connectors 322 may have a pitch between about 150 μm and about 1250 μm. In some embodiments, the external connectors 322 may be similar to external connectors 226 described above with respect to FIG. 7. After formation of the external connectors 226, a debonding of the carrier substrate 202 may be performed in a manner similar to the debonding described in FIG. 8.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

By utilizing the embodiments described herein, the performance of a device package may be improved, the cost of a device package may be decreased, and the reliability of a device package may be improved. Different features of embodiments described herein may be combined to achieve these and other benefits. In some cases, the use of metal-core solder balls as described may improve the conduction and reliability of electrical connections, and allow for less signal loss during high-speed operation. In some cases, the techniques described herein may be performed in a process flow with other typical fabrication processes, and thus may add little or no additional cost to existing processes. Additionally, using metal-core solder balls as described may result in improved yield, especially for device packages having larger areas. In some cases, the use of metal-core solder balls as described herein may be less costly than other techniques such as flip-chip techniques. The techniques and embodiments described herein may be applied to other types or configurations of packages, such as chip-on wafer (CoW) structures, system-in-package (SiP) structures, integrated fan-out package-on-package (InFO-PoP) structures or the like. The techniques described herein may also allow for a "component-first" process, in which the components (e.g., devices or chips) are placed before forming redistribution structures or other connection structures.

In an embodiment, a method includes placing metal-core solder balls on conductive pads of a first semiconductor device, wherein the metal-core solder balls include a metal core surrounded by a solder material, and forming a device structure, forming the device structure including placing the first semiconductor device on a carrier substrate, encapsulating the first semiconductor device with an encapsulant, wherein the encapsulant covers the metal-core solder balls, performing a planarization process on the encapsulant, wherein the planarization process exposes the metal-core solder balls, and forming a redistribution structure over the encapsulant and the first semiconductor device, wherein the redistribution structure is electrically connected to the metal-core solder balls. In an embodiment, the method includes performing a reflow process on the metal-core solder balls after placing the metal-core solder balls on the conductive pads. In an embodiment, the method includes placing a second semiconductor device on the carrier substrate. In an embodiment, the second semiconductor device includes metal-core solder balls, wherein the redistribution structure is electrically connected to the metal-core solder balls. In an embodiment, the second semiconductor device includes solder bumps, wherein the redistribution structure is electrically connected to the solder bumps. In an embodiment, the planarization process removes an upper portion of the metal-core solder balls. In an embodiment, after performing the planarization process, each metal-core solder ball has a surface level with a surface of the encapsulant. In an embodiment, the metal core includes copper. In an embodiment, the method includes attaching an interconnect structure to the redistribution structure. In an embodiment, the method includes attaching a lid to the device structure, the lid extending over the first semiconductor device and the encapsulant.

In an embodiment, a device includes multiple semiconductor devices on a carrier substrate, wherein each semiconductor device includes metal-core solder balls disposed on a side of the semiconductor device opposite the carrier substrate, a molding material over the semiconductor devices, wherein each of the semiconductor devices is separated by the molding material, wherein the metal-core solder balls of each semiconductor device have planar surfaces that are level with the molding material, a redistribution structure over the semiconductor devices, wherein the redistribution structure is electrically connected to each of the semiconductor devices, wherein the redistribution structure is electrically connected to the metal-core solder balls of each semiconductor device, and multiple conductive connectors on the redistribution structure, wherein the conductive connectors are electrically connected to the redistribution structure. In an embodiment, the metal-core solder balls include a core including copper and a layer of solder over the core. In an embodiment, the device includes an integrated passive device attached to the redistribution structure. In an embodiment, the device includes an interconnect structure attached to the conductive connectors. In an embodiment, the interconnect structure includes a core substrate and multiple routing layers. In an embodiment, the planar surface of each metal-core solder ball has a diameter between 10 μm and 300 μm.

In an embodiment, a package includes a device structure including a redistribution structure electrically connected to at least one first semiconductor device, wherein the at least one first semiconductor device is electrically connected to the redistribution structure by a plurality of metal-core solder balls, wherein each of the plurality of metal-core solder balls includes a ball of a metal at least partially covered by a solder material, and wherein the redistribution structure and the at least one semiconductor device is surrounded by a molding material. In an embodiment, the package includes an interconnect structure electrically connected to the redistribution structure, the interconnect structure including a routing structure formed over a substrate and an underfill material extending between the redistribution structure and the interconnect structure. In an embodiment, at least one first semiconductor device includes a memory die. In an embodiment, the device structure further includes at least one second semiconductor device, wherein the redistribution structure is electrically connected to the at least one second semiconductor device by solder bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing metal-core solder balls on conductive pads of a first semiconductor device, wherein the metal-core solder balls comprise a metal core surrounded by a solder material; and
   forming a device structure, forming the device structure comprising:
   placing the first semiconductor device on a carrier substrate;
   encapsulating the first semiconductor device with an encapsulant, wherein the encapsulant covers the metal-core solder balls;
   performing a planarization process on the encapsulant, wherein the planarization process exposes the metal-core solder balls; and
   forming a redistribution structure over the encapsulant and the first semiconductor device, wherein the redistribution structure is electrically connected to the metal-core solder balls.

2. The method of claim 1, further comprising performing a reflow process on the metal-core solder balls after placing the metal-core solder balls on the conductive pads.

3. The method of claim 1, further comprising placing a second semiconductor device on the carrier substrate.

4. The method of claim 3, wherein the second semiconductor device comprises metal-core solder balls, wherein the redistribution structure is electrically connected to the metal-core solder balls.

5. The method of claim 3, wherein the second semiconductor device comprises solder bumps, wherein the redistribution structure is electrically connected to the solder bumps.

6. The method of claim 1, wherein the planarization process removes an upper portion of the metal-core solder balls.

7. The method of claim 6, wherein after performing the planarization process, each metal-core solder ball has a surface level with a surface of the encapsulant.

8. The method of claim 1, wherein the metal core comprises copper.

9. The method of claim 1, further comprising attaching an interconnect structure to the redistribution structure.

10. The method of claim 1, further comprising attaching a lid to the device structure, the lid extending over the first semiconductor device and the encapsulant.

11. A device, comprising:
    a plurality of semiconductor devices on a carrier substrate, wherein each semiconductor device comprises metal-core solder balls disposed on a side of the semiconductor device opposite the carrier substrate;
    a molding material over the plurality of semiconductor devices, wherein each of the plurality of semiconductor devices is separated by the molding material, wherein the metal-core solder balls of each semiconductor device have planar surfaces that are level with the molding material;
    a redistribution structure over the plurality of semiconductor devices, wherein the redistribution structure is electrically connected to each of the plurality of semiconductor devices, wherein the redistribution structure is electrically connected to the metal-core solder balls of each semiconductor device; and
    a plurality of conductive connectors on the redistribution structure, wherein the conductive connectors are electrically connected to the redistribution structure.

12. The device of claim 11, wherein the metal-core solder balls comprise a core comprising copper and a layer of solder over the core.

13. The device of claim 11, further comprising an integrated passive device attached to the redistribution structure.

14. The device of claim 11, further comprising an interconnect structure attached to the plurality of conductive connectors.

15. The device of claim 14, wherein the interconnect structure comprises a core substrate and a plurality of routing layers.

16. The device of claim 11, wherein the planar surface of each metal-core solder ball has a diameter between 10 μm and 300 μm.

17. A package, comprising:
    a device structure comprising a redistribution structure electrically connected to at least one first semiconductor device, wherein the at least one first semiconductor device is electrically connected to the redistribution structure by a plurality of metal-core solder balls, wherein each of the plurality of metal-core solder balls comprises a metal ball that is at least partially covered by a solder material, wherein the metal ball of each metal-core solder ball of the plurality of metal-core solder balls has a planar surface that faces the redistribution structure, wherein a molding material extends between adjacent metal-core solder balls of the plurality of metal-core solder balls, wherein the at least one first semiconductor device is surrounded by the molding material.

18. The package of claim 17, further comprising an interconnect structure electrically connected to the redistribution structure, the interconnect structure comprising a routing structure formed over a substrate, and wherein an underfill material extends between the redistribution structure and the interconnect structure.

19. The package of claim 17, wherein the at least one first semiconductor device comprises a memory die.

20. The package of claim 17, wherein the device structure further comprises at least one second semiconductor device, wherein the redistribution structure is electrically connected to the at least one second semiconductor device by solder bumps.

* * * * *